United States Patent

Durand

Patent Number: 5,916,848
Date of Patent: Jun. 29, 1999

[54] SELF-ALIGNED THIN BARRIER HIGH TEMPERATURE SUPERCONDUCTOR EDGE JUNCTION

[75] Inventor: Dale J. Durand, Irvine, Calif.

[73] Assignee: TRW Inc., Redondo Beach, Calif.

[21] Appl. No.: 08/947,342

[22] Filed: Oct. 8, 1997

Related U.S. Application Data

[62] Division of application No. 08/743,647, Nov. 4, 1996.

[51] Int. Cl.$^6$ ..................................................... H01L 39/24
[52] U.S. Cl. .......................... 505/329; 505/190; 505/410; 505/702; 427/62; 427/63
[58] Field of Search ..................................... 505/329, 190, 505/702, 410; 257/31, 32, 33, 35; 427/62, 63

[56] References Cited

U.S. PATENT DOCUMENTS

| 4,028,714 | 6/1977 | Henkels | 357/5 |
| 5,100,694 | 3/1992 | Hunt et al. | 427/63 |

FOREIGN PATENT DOCUMENTS 63-313876  12/1988  Japan.

OTHER PUBLICATIONS

Faley et al, Appl. Phys. lett. 63(15) Oct. 1993, pp. 2138–2140.
Gao et al, Physica C171 (1990) pp. 126–130.

Primary Examiner—Roy V. King
Attorney, Agent, or Firm—Michael S. Yatsko

[57] ABSTRACT

An edge junction 10 with reduced parasitic inductance. The edge junction 10 has a laminar structure 22 including: a substrate 14; a first superconductive layer 12 deposited on a substrate 14; a first dielectric layer 16 deposited on the first superconductive layer 12; a second superconductive layer 18 deposited on the first dielectric layer 16; and a second dielectric layer 20 deposited on the second superconductive layer 18. The first and second superconductive layers 12 and 18 and the first and second dielectric layers 16 and 20 form a first laminar structure 22 having a planar segment 24 and a self-aligned ramp segment 26, the ramp segment 26 having a constantly-decreasing thickness and being connected to the planar segment 24 at an angle θ thereto. The edge junction 10 further includes a barrier layer 28 deposited on the first laminar structure 22; and a third superconductive layer 30 deposited on the barrier layer 28 to form: (i) a first Josephson junction 32 at the ramp segment 26 proximate the first superconductive layer 12 and (ii) a second Josephson junction 34 at the ramp segment 26 proximate the second superconductive layer 18. The overlap area of the first and the third superconductive layers 12 and 30 is greater than the overlap area of the second and the third superconductive layers 18 and 30, whereby the inductive parasitic effect of the first Josephson junction 32 on the second Josephson junction 34 is reduced. The superconductive layers 12, 18 and 30 are epitaxial with a c-axis in a direction substantially normal to the plane of the planar segment 24.

12 Claims, 3 Drawing Sheets

SELF-ALIGNED THIN BARRIER HIGH TEMPERATURE SUPERCONDUCTOR EDGE JUNCTION

This is a divisional of U.S. patent application Ser. No. 08/743,647, filed Nov. 4, 1996.

BACKGROUND OF THE INVENTION

The present invention generally relates to high-temperature superconductor (HTS) junctions, and in particular to self-aligned thin barrier HTS edge junctions.

With increasing demand on processing efficiency and speed of computing for computer and communication systems, HTS circuits have been utilized to perform high speed analog-to-digital (ADC) and digital-to-analog (DAC) operations such as 5 Gsps 8 bit, and logic functions such as 5 Gbps, at low power consumption for a wide range of applications in military and commercial systems.

In particular, HTS superconductor-normal conductor-superconductor (SNS) edge junctions have been utilized to provide high speed, low power operations in HTS integrated circuits to perform various ADC, DAC and digital functions. However, a major disadvantage of existing SNS junctions is excessive parasitic inductance, which requires the use of junctions with low critical current (Ic), and critical current to normal resistance (IcRn) product. A low IcRn product results in lower speed of operation of HTS circuits integrating existing SNS junctions.

There is, therefore, a need for an SNS junction which reduces parasitic inductance while preserving the IcRn product needed to realize low power, high speed advantages of HTS circuits.

SUMMARY OF THE INVENTION

The present invention satisfies these needs. The present invention provides a method of fabricating an edge junction with reduced parasitic inductance. The method of the present invention comprises the steps of: depositing a first superconductive layer on a substrate; depositing a first dielectric layer on the first superconductive layer; depositing a second superconductive layer on the first dielectric layer; and depositing a second dielectric layer on the second superconductive layer. The first and the second superconductive layers and the first and the second dielectric layers form a first laminar structure. The second superconductive layer is deposited to be thinner than the first superconductive layer.

The method further comprises the steps of: etching the first laminar structure to yield a planar segment and a ramp segment, the ramp segment having a constantly-decreasing thickness and being connected to the planar segment at an angle thereto; depositing a barrier layer on the etched laminar structure; and depositing a third superconductive layer on the barrier layer to form: (i) a first Josephson junction at the ramp segment proximate the first superconductive layer and (ii) a second Josephson junction at the ramp segment proximate the second superconductive layer. The overlap area between the edge of the first superconductive layer and the bottom of the third superconductive layer is greater than the overlap area between the edge of the second superconductive layer and the bottom of the third superconductive layer, whereby the inductive parasitic effect of the first Josephson junction on the second Josephson junction is reduced. The superconductive layers are epitaxial with a c-axis in a direction substantially normal to the plane of the planar segment.

Preferably, the second superconductive layer is selected to be thinner than the first and the third superconductive layers.

The second superconductive layer can be at least about one-third as thick as the first and the third superconductive layers. Preferably, the second Josephson junction-has a critical current capability of at most about one-third the critical current capability of the first Josephson junction.

As such, an edge junction according to the present invention comprises: the substrate; the first superconductive layer deposited on the substrate; the first dielectric layer deposited on the first superconductive layer; the second superconductive layer deposited on the first dielectric layer; and the second dielectric layer deposited on the second superconductive layer. The first and second superconductive layers and the first and second dielectric layers form the first laminar structure having the planar segment and the ramp segment, the ramp segment having a constantly-decreasing thickness and being connected to the planar segment at the angle thereto. The second superconductive layer is deposited to be thinner than the first superconductive layer.

The edge junction further comprises a barrier layer deposited on the first laminar structure; and a third superconductive layer deposited on the barrier layer to form: (i) the first Josephson junction at the ramp segment proximate the first superconductive layer and (ii) the second Josephson junction at the ramp segment proximate the second superconductive layer. The overlap area between the edge of the first superconductive layer and the bottom of the third superconductive layer is greater than the overlap area between the edge of the second superconductive layer and the bottom of the third superconductive layer, whereby the inductive parasitic effect of the first Josephson junction on the second Josephson junction is reduced. The superconductive layers are epitaxial with a c-axis in a direction substantially normal to the plane of the planar segment.

BRIEF DESCRIPTION OF THE DRAWINGS

These and other features, aspects and advantages of the present invention will become understood with reference to the following description, appended claims and accompanying drawings where:

DESCRIPTION OF THE PREFERRED EMBODIMENTS

Figure 1:
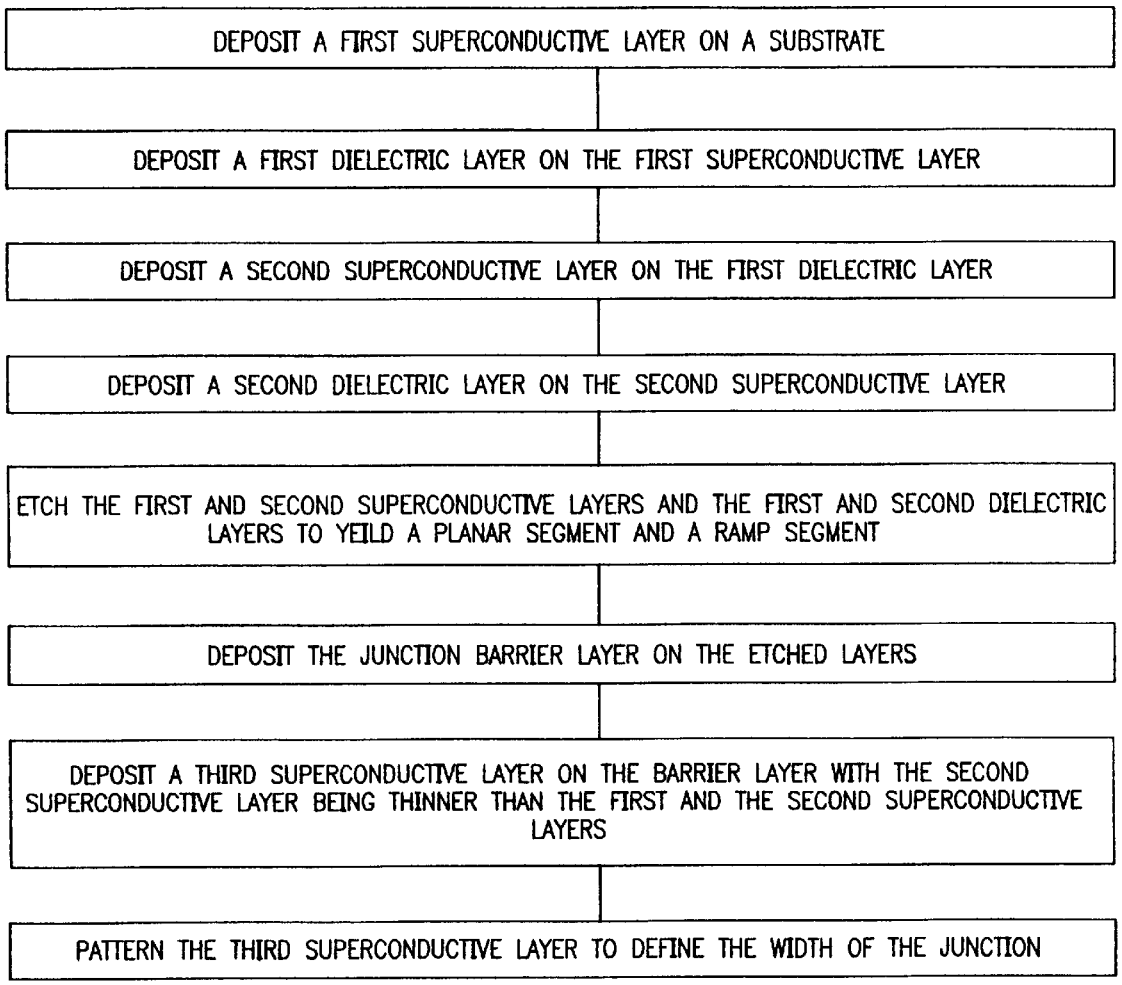
FIG. 1 illustrates the steps of a method of fabricating an edge junction according to the present invention.

Referring to FIG. 1, a method of fabricating an edge junction 10 with reduced parasitic inductance according to the present invention includes the steps of: depositing a first superconductive layer 12 on a substrate 14; depositing a first dielectric layer 16 on the first superconductive layer 12; depositing a second superconductive layer 18 on the first dielectric layer 16; and depositing a second dielectric layer 20 on the second superconductive layer 18. The first and the second superconductive layers 12 and 18 and the first and second dielectric layers 16 and 20 form a first laminar structure 22.

The method further comprises the steps of: etching the first laminar structure 22 to yield a planar segment 24 and a ramp segment 26, the ramp segment 26 having a constantly-decreasing thickness and being connected to the planar segment 24 at an angle θ thereto; depositing a barrier layer 28 on the etched laminar structure 22; and depositing a third superconductive layer 30 on the barrier layer 28 to form: (i) a first Josephson junction 32 at the ramp segment 26 proximate the first superconductive layer 12 and (ii) a second Josephson junction 34 at the ramp segment 26 proximate the second superconductive layer 18.

The overlap area forming a junction between the first and the third superconductive layers 12 and 30 is greater than the overlap area forming a junction between the second and the third superconductive layers 18 and 30, whereby the critical current of the first Josephson junction will be larger and the inductive parasitic effect of the first Josephson junction 32 on the second Josephson junction 34 is reduced.

The superconductive layers 12, 18 and 30 are epitaxial with a c-axis in a direction substantially normal to the plane of the planar segment 24. The second superconductive layer 18 can be selected thinner than the first and the third superconductive layers 12 and 30, whereby the parasitic inductance of the first Josephson junction 32 on the second Josephson junction 34 is reduced as described below.

Because the second superconductive layer 18 is thin, it has high inductance. As such, the first and the third superconductive layers 12 and 30 are selected thicker than the second superconductive layer 18 to compensate for the high inductance of the second superconductive layer 18. In general, thicker layers have lower inductance and thinner layers have higher inductance. Selecting the second superconductive layer 18 thin, increases the inductance of the second superconductive layer 18, which is partially compensated for by selecting the first and third superconductive layers 12 and 30 relatively thicker.

Advantageously, the etching step for cutting the layers 12, 16, 18 and 20 is a one-step process. The third superconductive layer 30 is then deposited as a separate step. The third superconductive layer 30 can be deposited on the ramp segment 26 as desired. As such, the third superconductive layer 30 is self-aligned and, advantageously, need not be accurately positioned relative to features of the other layers 12, 16, 18, 20 and 28. The third superconductive layer 30 is patterned to define the width of the junctions 32 and 34.

Figure 2:
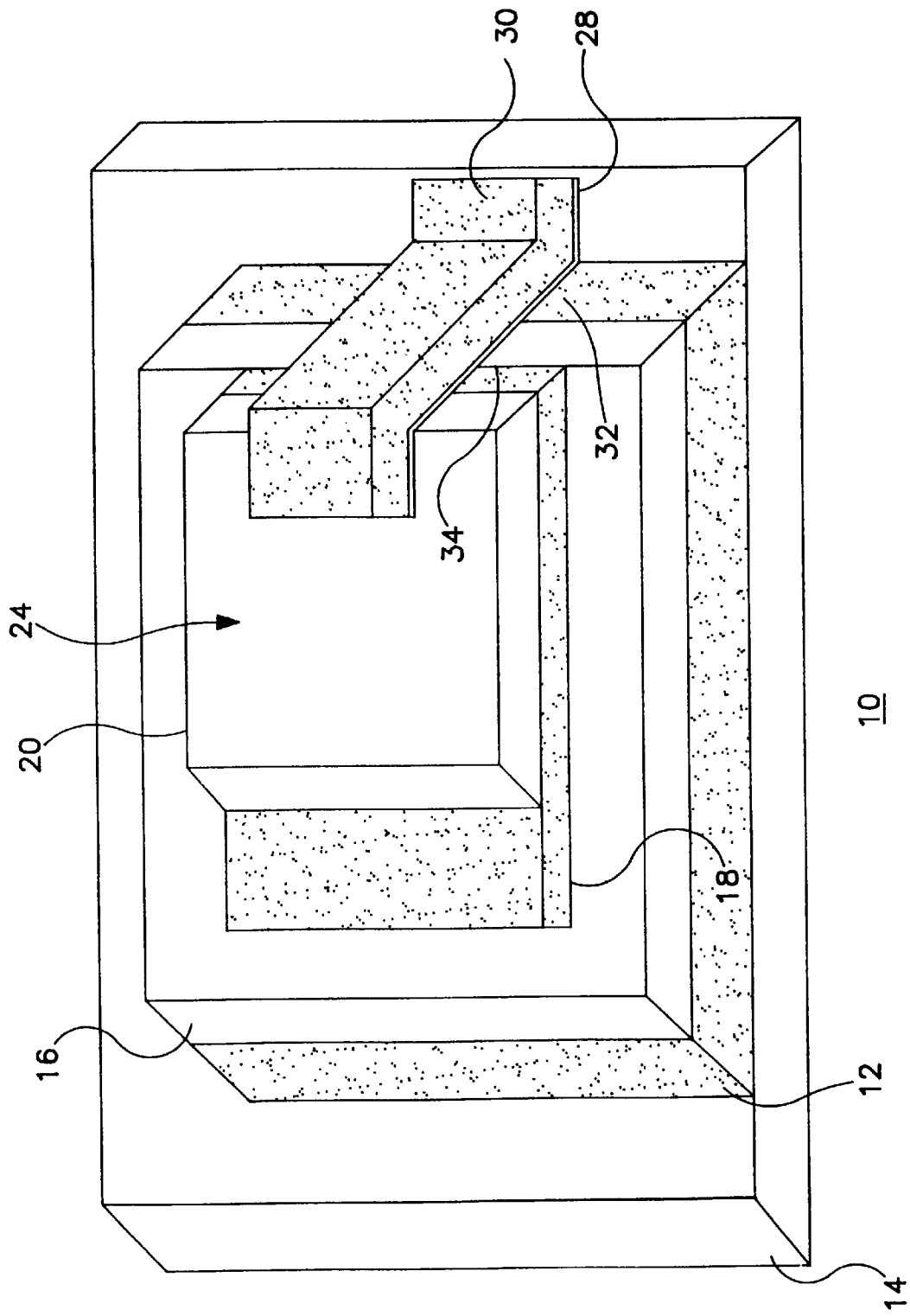
FIG. 2 illustrates a perspective view of an edge junction fabricated according to the method of FIG. 1.
Figure 3:
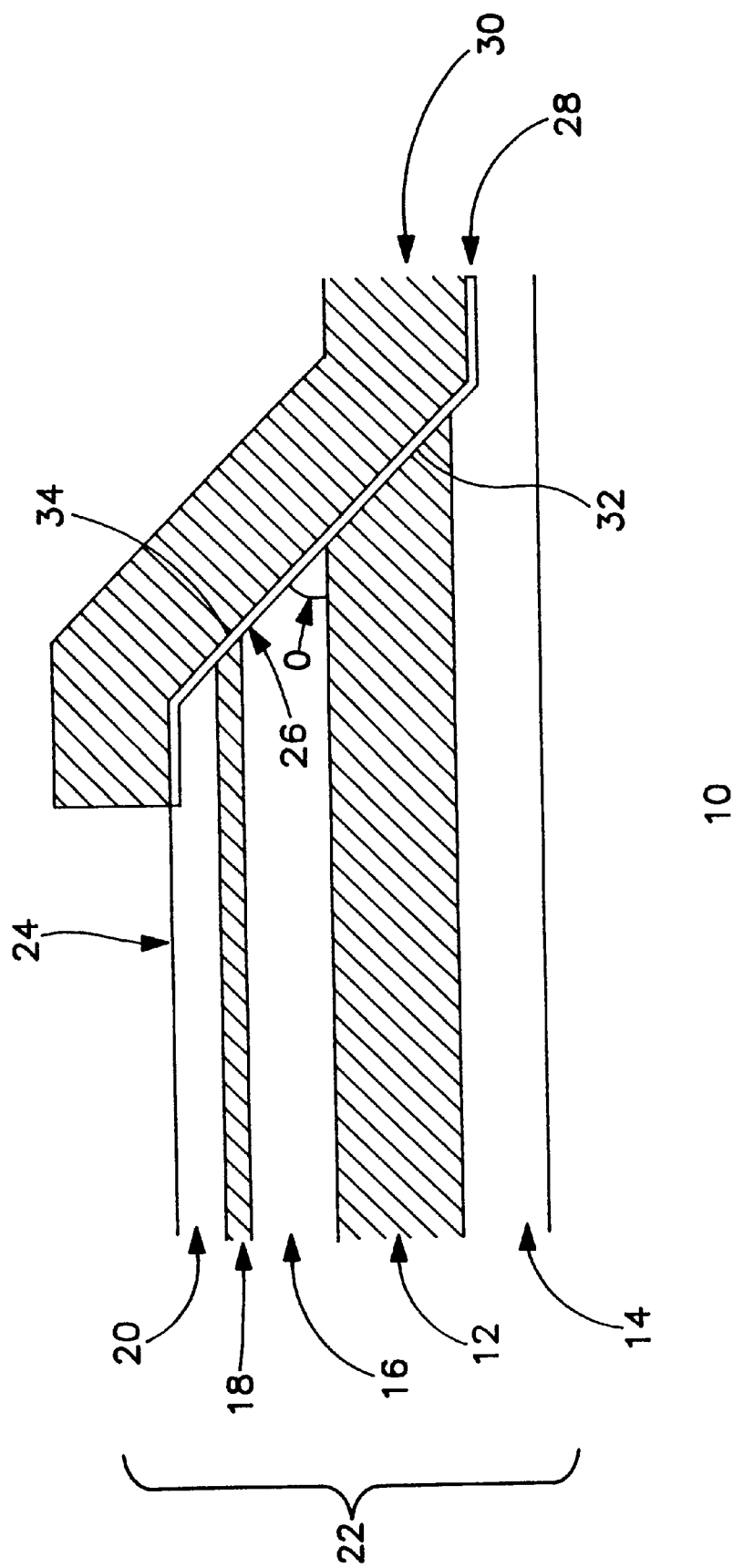
FIG. 3 illustrates a side view of the edge junction of FIG. 2.

As shown in FIGS. 2 and 3, the edge junction 10 includes the substrate 14; the first superconductive layer 12 deposited on the substrate 14; the first dielectric layer 16 deposited on the first superconductive layer 12; the second superconductive layer 18 deposited on the first dielectric layer 16; and the second dielectric layer 20 deposited on the second superconductive layer 18. The first and second superconductive layers 12 and 18 and the first and second dielectric layers 16 and 20 form a first laminar structure 22 having the planar segment 24 and the ramp segment 26, the ramp segment 26 having a constantly-decreasing thickness and being connected to the planar segment 24 at the angle θ thereto. The angle θ is generally less than about 45° and preferably less than about 35°.

The edge junction 10 further comprises a barrier layer 28 deposited on the first laminar structure 22; and the third superconductive layer 30 deposited on the barrier layer 28 to form: (i) the first Josephson junction 32 at the ramp segment 26 proximate the first superconductive layer 12 and (ii) the second Josephson junction 34 at the ramp segment 26 proximate the second superconductive layer 18. The overlap area forming a junction between the first and the third superconductive layers 12 and 30 is greater than the overlap area forming a junction between the second and the third superconductive layers 18 and 30, whereby the inductive parasitic effect of the first Josephson junction 32 on the second Josephson junction 34 is reduced.

Advantageously, the area of overlap between the third superconductive layer 30 and the second superconductive layer 18 is smaller than the area of overlap between the third superconductive layer 30 and the first superconductive layer 12. Therefore, the first Josephson junction 32 is capable of carrying high currents due to low inductance so that it does not interfere with the operation of the second Josephson junction 34.

If the first and the second Josephson junctions 32 and 34 are comparable in current or inductance characteristics, the first Josephson junction 32 behaves as an additional parasitic inductance in relation to the second Josephson junction 34. A high overlap area between the third superconductive layer 30 and the first superconductive layer 12 results in an effectively low parasitic inductance due to the first Josephson junction 32.

In existing edge junctions, the electrical parameters such as critical current (Ic) and critical current to normal resistance product (IcRn) are not independently variable from the edge junctions' series geometric inductance. By selecting the relative thickness of the superconductive layers 12, 18 and 30 according to the present invention, advantageously, the aforementioned parameters of each Josephson junction 32 and 34 can be separated and each optimized independently.

The second superconductive layer 18 is from about 250 Å to about 3,000 Å in thickness. Preferably, the first and the third superconductive layers 12 and 30 are at least about three times the thickness of the second superconductive layer 18. An example embodiment of the edge junction 10 can include a second superconductive layer 18 of about 500 Å in thickness, and a first and a third superconductive layer 12 and 30 of about 1,500 Å in thickness each.

The dielectric layers 16 and 20 can be from about 1,000 Å to about 3,000 Å in thickness. For the above example, the dielectric layers 16 and 20 can be about 1,500 Å in thickness.

The width of the third superconductive layer 30 over the ramp segment 26 can be from about 2 microns to about 10 microns. Preferably, the width of the third superconductive layer 30 is about 4 microns.

The second superconductive layer 18 is at least about 2 microns wider than the third superconductive layer 30 per side as shown in the Figures. Therefore, the second superconductive layer 18 is about 4 microns wider than the third superconductive layer 30.

The dielectric layers 16 and 20, and the first superconductive layer 12 can be as wide and as long as required for a particular circuit design. For example, the dielectric layers 16 and 20, and the first superconductive layer 12 can be at least about 20 microns in length and at most about 1 millimeter in length.

The operating temperature range of the Josephson junctions 32 and 34 is about 65 K, with IcRn ranging from about 300 to about 500 microvolts, and Ic ranging from about 100 to about 300 microamps.

Rn can range from about 1 to about 3 ohms, Ic can range from about 100 to about 300 microamps, and IcRn can range from about 300 to about 500 microvolts. Preferably, the value of IcRn is as large as possible, for example 500 microvolts. Existing SNS junctions can only achieve values for Ic and IcRn which are at most one-third of the values achieved by the present invention.

The superconductive layers 12, 18 and 30 are preferably selected from the group consisting essentially of high-temperature superconductors such as YBCO. The first and second dielectric layers 16 and 20 can be selected from the group consisting essentially of insulators such as $SrTiO_3$. Further, the first and second dielectric layers 16 and 20 can be epitaxial in configuration. The junction barrier layer 28 can be a normal barrier between the third superconductive layer 30 and the etched laminar structure 22. The normal barrier can be cobalt-doped YBCO, PBCO, calcium ruthenate, calcium-doped YBCO or Gallium-doped PBCO. The substrate can be Neodymium gallate, Lanthanum aluminate or yttrium-doped zirconium, among others. The normal barrier can be about 5 to about 50 nm in thickness.

The advantage of the edge junction 10 of the present invention is that it can operate at speeds proportional to the increase in IcRn product. In a conventional Co-YBCO junction, for example, the speed of the junction is limited to 40 GHz with 150 microvolt IcRn. A Co-YBCO junction according to the present invention, advantageously, can achieve 160 GHz with 600 microvolt IcRn. A significant improvement. The barrier 28 and the counter-electrode. (the N-S of an S-N-S junction) can be deposited in-situ.

The present invention has been described in considerable detail with reference to certain preferred versions thereof; however, other versions are possible. For example, instead of etching, a lift-off process can be utilized to create the ramp segment. Therefore, the spirit and scope of the appended claims should not be limited to the description of the preferred versions contained herein.

What is claimed is:

1. A method of fabricating an edge junction with reduced parasitic inductance, the edge junction having a laminar structure, the method comprising the steps of:
   (a) depositing a first superconductive layer on a substrate;
   (b) depositing a first dielectric layer on the first superconductive layer;
   (c) depositing a second superconductive layer on the first dielectric layer;
   (d) depositing a second dielectric layer on the second superconductive layer;
   wherein the first and second superconductive layers and the first and second dielectric layers form a first laminar structure;
   (e) etching the first laminar structure to yield a planar segment and a ramp segment, the ramp segment having a constantly-decreasing thickness and being connected to the planar segment at an angle thereto;
   (f) depositing a barrier layer on the etched laminar structure; and
   (g) depositing a third superconductive layer on the barrier layer to form: (i) a first Josephson junction at the ramp segment proximate the first superconductive layer having a first contact area and (ii) a second Josephson junction at the ramp segment proximate the second superconductive layer having a second contact area, said first and third superconductive layers each having a thickness greater than said second superconductive layer and said first contact area between said first and third superconductive layers being greater than said second contact area between said second and third superconductive layers; whereby the greater contact area between the third and first superconductive layers reduces the inductive parasitic effect of the first Josephson junction on the second Josephson junction;
   wherein the superconductive layers are epitaxial with a c-axis in a direction substantially normal to the plane of the planar segment.

2. The method of claim 1 wherein the step of depositing the second superconductive layer includes selecting the second superconductive layer to be at most about one-third the thickness of the first superconductive layer.

3. The method of claim 1 wherein the step of depositing the second superconductive layer includes selecting the second superconductive layer to be at most about one-third the thickness of the third superconductive layer.

4. The method of claim 1 wherein the critical current of the second Josephson is at most about one-third the critical current of the first Josephson junction.

5. The method of claim 1 wherein the step of etching includes etching the first laminar structure so that the angle of the ramp segment to the planar segment is at most about 45 degrees.

6. The method of claim 5 wherein the angle is less than about 35 degrees.

7. The method of claim 1 wherein the steps of depositing the first, the second and the third superconductive layers include selecting said superconductive layers from the group consisting essentially of high temperature superconductors.

8. The method of claim 1 wherein the steps of depositing the first and second non-superconductive layers include selecting the first and second dielectric layers from the group consisting essentially of insulators.

9. The method of claim 1 wherein the step of depositing the barrier layer includes selecting the barrier layer from the group consisting essentially of normal barriers.

10. A method of fabricating an edge junction with reduced parasitic inductance, the edge junction having a laminar structure, the method comprising the steps of:
   (a) depositing a first superconductive layer on a substrate;
   (b) depositing a first dielectric layer on the first superconductive layer;
   (c) depositing a second superconductive layer on the first dielectric layer;
   (d) depositing a second dielectric layer on the second superconductive layer; wherein the first and second superconductive layers and the first and second dielectric layers form a first laminar structure;
   (e) etching the first laminar structure to yield a planar segment and a ramp segment, the ramp segment having a constantly-decreasing thickness and being connected to the planar segment at an angle of, at most, about 35 degrees thereto;
   (f) depositing a barrier layer on the etched laminar structure; and
   (g) depositing a third superconductive layer on the barrier layer to form: (i) a first Josephson junction at the ramp segment proximate to the first superconductive layer having a first contact area and (ii) a second Josephson junction at the ramp segment proximate the second super-conductive layer having a second contact area;
   wherein the superconductive layers are epitaxial with a c-axis in a direction substantially normal to the plane of the planar segment; and
   wherein the second superconductive layer is, at most, about one-third as thick as the first and the third superconductive layers, said first contact area between said first and third superconductive layers being greater than said second contact area between said second and third superconductive layers; whereby the greater contact area between the third and first superconductive layers reduces the inductive parasitic effect of the first Josephson junction on the second Josephson junction.

11. The method of claim 10 wherein the critical current of the second Josephson junction is at most about one-third the critical current of the first Josephson junction.

12. The method of claim 11 wherein:
(a) the steps of depositing the first, the second and the third superconductive layers include selecting said superconductive layers from the group consisting essentially of high temperature superconductors;

(b) the steps of depositing the first and second dielectric layers include selecting the first and second dielectric layers from the group consisting essentially of insulators; and (c) the step of depositing the junction barrier layer includes selecting the junction barrier layer from the group consisting essentially of normal barriers.

* * * * *

UNITED STATES PATENT AND TRADEMARK OFFICE
CERTIFICATE OF CORRECTION

PATENT NO. : 5,916,848
DATED : June 29, 1999
INVENTOR(S) : Dale J. Durand and Kei F. Lau It is certified that error appears in the above-identified patent and that said Letters Patent is hereby corrected as shown below:

<u>Title page,</u>
Item 75 Inventor - Omitted second Inventor's Name
Add - Kei F. Lau, Rolling Hills, Calif.

Signed and Sealed this

Fourteenth Day of August, 2001

*Attest:*

*Nicholas P. Godici*

*Attesting Officer*

NICHOLAS P. GODICI
*Acting Director of the United States Patent and Trademark Office*